United States Patent
Usami

(10) Patent No.: US 11,806,827 B2
(45) Date of Patent: Nov. 7, 2023

(54) METHOD FOR MANUFACTURING WIRE SAW APPARATUS AND WIRE SAW APPARATUS

(71) Applicant: SHIN-ETSU HANDOTAI CO., LTD., Tokyo (JP)

(72) Inventor: Yoshihiro Usami, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 1450 days.

(21) Appl. No.: 16/086,554

(22) PCT Filed: Feb. 24, 2017

(86) PCT No.: PCT/JP2017/006980
§ 371 (c)(1),
(2) Date: Sep. 19, 2018

(87) PCT Pub. No.: WO2017/183295
PCT Pub. Date: Oct. 26, 2017

(65) Prior Publication Data
US 2019/0105750 A1    Apr. 11, 2019

(30) Foreign Application Priority Data
Apr. 21, 2016 (JP) ................... 2016-085208

(51) Int. Cl.
*B24B 27/06* (2006.01)
*H01L 21/304* (2006.01)
(Continued)

(52) U.S. Cl.
CPC .......... *B24B 27/0633* (2013.01); *B24B 5/363* (2013.01); *B24B 5/37* (2013.01);
(Continued)

(58) Field of Classification Search
CPC .... B65H 54/28; B65H 59/10; B65H 2701/36; H01L 21/304; B23D 57/0061;
(Continued)

(56) References Cited

U.S. PATENT DOCUMENTS 4,369,934 A * 1/1983 Spies ..................... B65H 54/28
156/169
6,408,840 B2 * 6/2002 Ishida .................. B28D 5/0082
125/21
(Continued)

FOREIGN PATENT DOCUMENTS

CN         201645272 U    11/2010
JP         H02-124253 A    5/1990
(Continued)

OTHER PUBLICATIONS

Machine Translation of JP-200308925-A to Yamanoguchi (filename: 16086554_-_JP2000308925A_-_Yamanoguchi_Translation.pdf) (Year: 2000).*
(Continued)

*Primary Examiner* — Don M Anderson
*Assistant Examiner* — Jonathan R Zaworski
(74) *Attorney, Agent, or Firm* — Oliff PLC

(57) ABSTRACT

A method for manufacturing a wire saw apparatus including a wire supply reel; a long roller; wire guides; a wire winding reel; and a tension arm controlled to move within a control angle of ±A (°) set in advance and configured to apply tension to the wire, the method including the steps of: measuring a surface roughness Rmax of the long roller; measuring an angle a (°) of the tension arm at which the tension arm swings outside a range of the control angle set in advance while the wire is extending from the wire supply reel; calculating R1×2×A÷(|a|+A)=R2, where R1 (μm) represents the measured surface roughness Rmax of the long (Continued)

roller; and adjusting the surface roughness Rmax of the long roller to the calculated numerical value R2 or less. The method for manufacturing a wire saw apparatus can prevent the tension arm from greatly swinging outside the control range.

4 Claims, 3 Drawing Sheets

(51) Int. Cl.
*B28D 5/04* (2006.01)
*B24B 5/36* (2006.01)
*B24B 5/37* (2006.01)
*B65H 54/28* (2006.01)
*B65H 59/10* (2006.01)

(52) U.S. Cl.
CPC ............. *B24B 27/06* (2013.01); *B28D 5/04* (2013.01); *B28D 5/045* (2013.01); *H01L 21/304* (2013.01); *B65H 54/28* (2013.01); *B65H 59/10* (2013.01); *B65H 2701/36* (2013.01)

(58) Field of Classification Search
CPC ...... B23D 57/0069; B28D 1/08; B28D 1/124; B28D 1/04; B28D 1/042; B28D 1/045
See application file for complete search history.

(56) References Cited

U.S. PATENT DOCUMENTS

| | | | | |
|---|---|---|---|---|
| 7,926,478 B2* | 4/2011 | Nakai | ................ | B23D 57/0061 |
| | | | | 125/16.02 |
| 8,037,878 B2* | 10/2011 | Kitagawa | ............... | B28D 5/045 |
| | | | | 451/7 |
| 8,616,191 B2* | 12/2013 | Hamann | ............ | B23D 57/0023 |
| | | | | 125/20 |
| 9,802,784 B2* | 10/2017 | Rychener | ............... | B65H 51/14 |

FOREIGN PATENT DOCUMENTS

| | | | |
|---|---|---|---|
| JP | H11-156694 A | | 6/1999 |
| JP | 2000-061801 A | | 2/2000 |
| JP | 2000061801 A | * | 2/2000 |
| JP | 2000308925 A | * | 11/2000 |

OTHER PUBLICATIONS

Machine Translation of JP-2000061801-A to Matsuzaki (filename: 16086554_2023-04-21_JP_2000061801_A_H.pdff) (Year: 2000).*
Jun. 3, 2020 Office Action issued in Taiwanese Patent Application No. 106106620.
Apr. 11, 2017 International Search Report issued in International Patent Application No. PCT/JP2017/006980.
Nov. 25, 2019 Office Action issued in Chinese Patent Application No. 201780018553.1.

* cited by examiner

METHOD FOR MANUFACTURING WIRE SAW APPARATUS AND WIRE SAW APPARATUS

TECHNICAL FIELD

The present invention is associated with a wire saw cutting technology, and relates to a method for manufacturing a wire saw apparatus and a wire saw apparatus applicable to, for example, a wafer cutting step of cutting (slicing) a workpiece, such as a silicon semiconductor single crystal ingot, into a wafer.

BACKGROUND ART

For example, in the semiconductor manufacturing field, a silicon semiconductor single crystal ingot pulled by a single crystal pulling apparatus is thinly cut orthogonally to the axial direction by using an inner peripheral slicer, so that a plurality of silicon semiconductor wafers are obtained.

However, the recent trend of increasing the diameter of semiconductor wafers makes it difficult to cut the ingot with a conventional inner peripheral slicer. Meanwhile, the cutting method with an inner peripheral slicer has problems of low efficiency and productivity because wafers are sliced off one by one.

Hence, recently, attention has been focused on a cutting method with a wire saw (particularly, multi wire saw). In this cutting method, a workpiece is pressed against a wire row spirally wound around several wire guides (main rollers), and the wire is moved while a slurry is supplied to the contact portion between the workpiece and the wire. Thus, the workpiece is cut into wafers (for example, Patent Literature 1). Such a cutting method is capable of slicing off a large number of (for example, 100) wafers at a time.

CITATION LIST

Patent Literature

Patent Literature 1: Japanese Unexamined Patent Application Publication No. Hei 11-156694

DISCLOSURE OF INVENTION

Problem to be Solved by the Invention

In a wire saw apparatus used in a cutting method with a wire saw as described above, a long roller, tension arms, and so forth are arranged between a wire supply reel and wire guides. A wire extending from the wire supply reel passes on the long roller while moving in an axial direction of the long roller. In this event, a wire not smoothly moving in the axial direction of the long roller spontaneously returns to an inherent position (where the length of the travelling wire is the shortest) in some cases.

In such a case, the tension arm on the wire supply reel side greatly swings outside the control range, resulting in a problem of wire breakage. If a wire breaks, this leads to quality degradation in the workpiece during the cutting process.

The present invention has been made in view of the above-described problems of conventional techniques. An object of the present invention is to provide a method for manufacturing a wire saw apparatus and a wire saw apparatus which is capable of preventing a tension arm from greatly swinging outside a control range while a wire extending from a wire supply reel smoothly moves in an axial direction on a long roller.

Means for Solving Problem

To achieve the above object, the present invention provides a method for manufacturing a wire saw apparatus including:
a wire supply reel from which a wire extends;
a long roller having a surface on which the wire extending from the wire supply reel can pass;
a plurality of wire guides around which the wire is spirally wound;
a wire winding reel which winds the wire; and
a tension arm which is arranged between the wire supply reel and the wire guides, controlled to move within a control angle of $\pm A$ (°) set in advance, and configured to apply tension to the wire, wherein
the wire can pass on the long roller while moving in an axial direction of the long roller, and
the method comprises the steps of:
measuring a surface roughness Rmax of the long roller;
measuring an angle a (°) of the tension arm at which the tension arm swings outside a range of the control angle set in advance while the wire is extending from the wire supply reel;
calculating $R1 \times 2 \times A \div (|a| + A) = R2$, where R1 (μm) represents the measured surface roughness Rmax of the long roller; and
adjusting the surface roughness Rmax of the long roller to the calculated numerical value R2 or less.

Accordingly, it is possible to manufacture a wire saw apparatus in which the wire extending from the wire supply reel smoothly moves on the long roller in the axial direction, preventing the tension arm from greatly swinging outside the control range, and preventing wire breakage.

Note that, herein, the surface roughness Rmax refers to the highest sectional height in a sectional curve measured according to JIS B0601.

In the situation, it is preferable to use the long roller made of a urethane having a Shore A hardness of 80 to 96.

The use of the long roller having a hardness within such a range facilitates the smooth movement of the wire, reduces the deformation and shape deterioration of the long roller, and can increase the durable number of times. When the Shore A hardness is 80 or more, the long roller is prevented from deforming, and the number of uses can be increased. When the Shore A hardness is 96 or less, the processing for reducing the surface roughness (polishing) can be efficiently performed.

Moreover, in the situation, in the step of adjusting the surface roughness Rmax of the long roller to the calculated numerical value R2 or less, the surface of the long roller is preferably polished with a polishing film of #800 to 3000, so that the surface roughness Rmax of the long roller is adjusted to the calculated numerical value R2 or less.

In this manner, the use of the mesh number #800 or higher more surely enables the surface roughness Rmax of the long roller to be R2 or less. Meanwhile, the use of the mesh number #3000 or lower prevents the clogging of the polishing film, and allows efficient polishing.

In addition, the present invention provides a wire saw apparatus comprising:
a wire supply reel from which a wire extends;
a long roller having a surface on which the wire extending from the wire supply reel can pass;

a plurality of wire guides around which the wire is spirally wound;
a wire winding reel which winds the wire; and
a tension arm which is arranged between the wire supply reel and the wire guides, controlled to move within a control angle of ±A (°) set in advance, and configured to apply tension to the wire, wherein
the wire can pass on the long roller while moving in an axial direction of the long roller, and
the long roller has a surface roughness Rmax of 21 μm or less.

Accordingly, in the wire saw apparatus, the wire extending from the wire supply reel smoothly moves on the long roller in the axial direction, preventing the tension arm from greatly swinging outside the control range, and making it possible to prevent wire breakage.

In the situation, the long roller is preferably made of a urethane having a Shore A hardness of 80 to 96.

The long roller having a hardness within such a range facilitates the smooth movement of the wire, reduces the deformation and shape deterioration of the long roller, and can increase the durable number of times. When the Shore A hardness is 80 or more, the long roller is prevented from deforming, and the number of uses can be enhanced. When the Shore A hardness is 96 or less, the processing for reducing the surface roughness (polishing) can be efficiently performed.

Effect of the Invention

The inventive method for manufacturing a wire saw apparatus and the inventive wire saw apparatus enable a wire saw apparatus in which the wire extending from the wire supply reel smoothly moves on the long roller in the axial direction, preventing the tension arm from greatly swinging outside the control range, and making it possible to prevent wire breakage.

BEST MODES FOR CARRYING OUT THE INVENTION

Figure 1A:
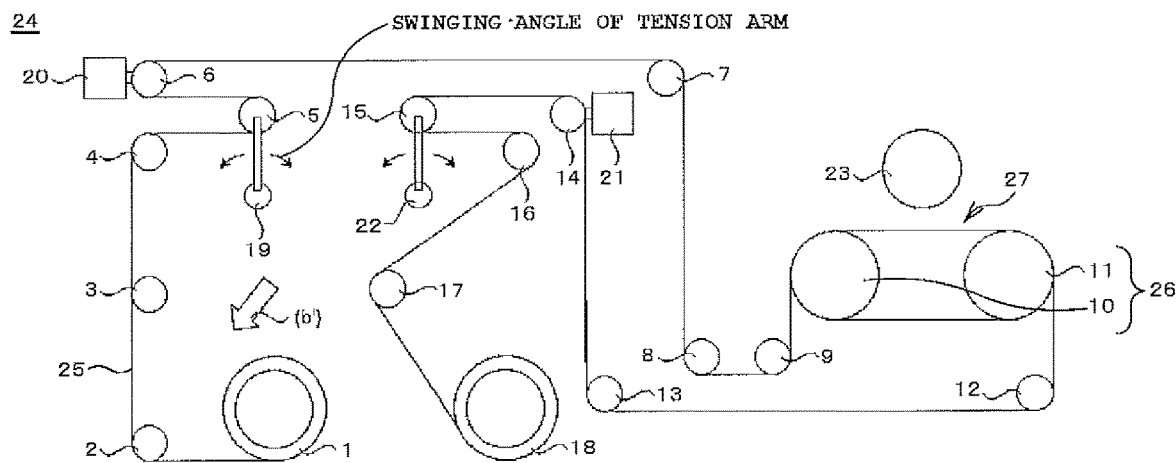
FIG. 1(a) is a schematic view showing an example of the inventive wire saw apparatus.

Hereinafter, embodiments of the present invention will be described. However, the present invention is not limited thereto.

As described above, in a wire saw in which a wire extending from a wire supply reel passes on a long roller while moving in an axial direction thereof, a wire not smoothly moving in the axial direction of the long roller spontaneously returns to the inherent position in some cases. In this case, a tension arm on the wire supply reel side greatly swings outside the control range, resulting in a problem that the wire breaks.

Hence, the present inventor has conducted earnest studies to solve such a problem. Consequently, the inventor has considered that regulating the surface roughness Rmax of the long roller allows the wire extending from the wire supply reel to smoothly move on the long roller in the axial direction, and can prevent the tension arm from greatly swinging outside the control range, making it possible to prevent the wire breakage by this great swing. Further, the inventor has carefully examined the best mode to carry out these and completed the present invention.

First, the inventive wire saw apparatus 24 will be described with reference to FIGS. 1(a) and (b). As exemplified in FIG. 1(a), the inventive wire saw apparatus 24 includes: a wire supply reel 1 from which a wire 25 extends; a long roller 2 having a surface on which the wire 25 extending from the wire supply reel 1 can pass; a plurality of wire guides 26 around which the wire 25 is spirally wound; a wire winding reel 18 which winds the wire 25; and a tension arm 19 which is arranged between the wire supply reel 1 and the wire guides 26, controlled to move within a control angle of ±A (°) set in advance, and configured to apply tension to the wire 25. Additionally, as shown in FIG. 1(b), the wire 25 can pass on the long roller 2 while moving in an axial direction of the long roller 2.

The wire guides 26 can, for example, consist of two parts: a main wire guide 10 and a slave wire guide 11.

The wire 25 extending from the wire supply reel 1 passes over the long roller 2, a traverser 3, a pulley 4, a tension arm pulley 5, a tension sensor pulley 6, a pulley 7, a pulley 8, and a pulley 9, and then the wire 25 is wound around the main wire guide 10 and the slave wire guide 11 at predetermined pitches in parallel, thus forming a wire row 27. Moreover, the wire row 27 is configured to cut a workpiece 23 when the workpiece 23 is lowered to the wire row 27.

Further, the wire 25 reeled out from the slave wire guide 11 passes over a pulley 12, a pulley 13, a tension sensor pulley 14, a tension arm pulley 15, a pulley 16, and a traverser 17, and then the wire 25 is wound around the wire winding reel 18.

Note that, in the wire saw apparatus 24 of this embodiment, the traverser 3 can be used only when the travelling direction of the wire 25 is reversed and the wire supply reel 1 winds the wire.

In the wire saw apparatus 24 of this embodiment, based on tension detected by a tension sensor 20, the position of the tension arm pulley 5 moves centering on the tension arm 19 within a certain control angle of ±A (°) set in advance (the tension arm 19 swings), so that tension from the wire supply reel 1 to the main wire guide 10 can be controlled. In addition, similarly, the tension from the slave wire guide 11 to the wire winding reel 18 can also be controlled as the position of the tension arm pulley 15 moves centering on a tension arm 22 within a certain control range based on tension detected by a tension sensor 21.

In this event, the control angle of ±A (°) of the tension arm 19 can be set, for example, within a range of ±1.5°.

Then, when the wire 25 extends from the wire supply reel 1 as exemplified in FIG. 1(b), the wire 25 extending from the wire supply reel 1 extends while moving in an axial direction of the wire supply reel 1. Thus, the wire 25 passes on the long roller 2 toward the pulley 4 while moving in the axial direction of the long roller 2.

In this situation, in a conventional wire saw apparatus, when the wire 25 does not move smoothly on the long roller 2, the wire 25 is caught thereon. Then, the wire 25 in such a state spontaneously returns to an inherent position (where the length of the travelling the wire 25 is the shortest). Consequently, the tension arm 19 greatly swings.

In the inventive wire saw apparatus 24, the long roller 2 has a surface roughness Rmax of 21 μm or less. Further, the long roller 2 preferably has a smaller surface roughness Rmax because the smaller the surface roughness Rmax, the more likely it is that the wire 25 smoothly moves on the long roller 2 in the axial direction of the long roller 2, and the more stably the tension arm 19 swings. Accordingly, this long roller 2 has a sufficiently small surface roughness Rmax. This enables the wire 25 extending from the wire supply reel 1 to smoothly move on the long roller 2 in the axial direction, makes it possible to prevent the tension arm 19 from greatly swinging outside the control range. Thus, the breakage of the wire 25 can be reduced. Meanwhile, the lower limit of the surface roughness Rmax of the long roller 2 is not particularly limited, and may be, for example, 0 μm or more.

In this situation, the long roller 2 is preferably made of a urethane having a Shore A hardness of 80 to 96. The long roller 2 having a hardness within such a range facilitates the smooth movement of the wire 25, reduces the deformation and shape deterioration of the long roller 2, and can increase the durable number of times. Specifically, when the Shore A hardness is 80 or more, the long roller 2 is prevented from deforming, and the number of uses can be enhanced. When the Shore A hardness is 96 or less, the processing for reducing the surface roughness (polishing) can be efficiently performed.

Next, the inventive method for manufacturing a wire saw apparatus will be described. Here, using a process chart shown in FIG. 2, the description will be given of a case of manufacturing the inventive wire saw apparatus 24 shown in FIG. 1(a).

Figure 2:
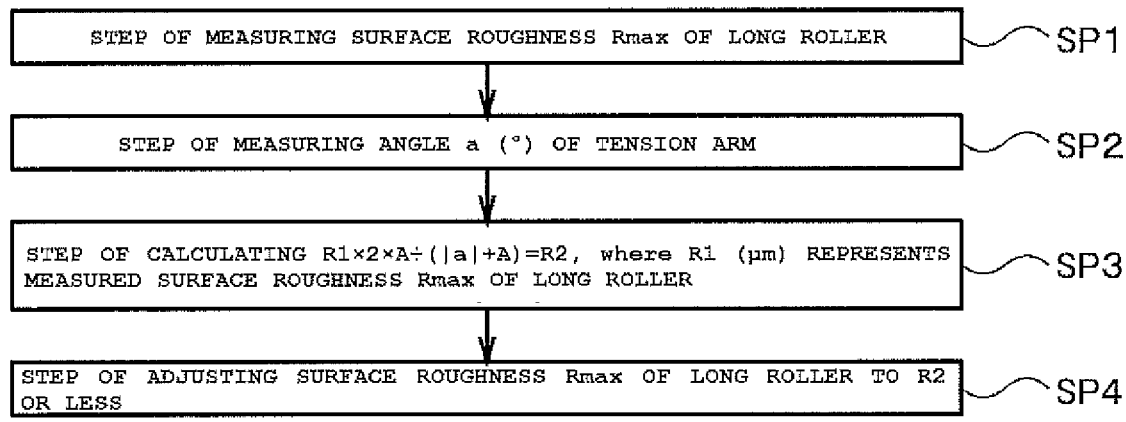
FIG. 2 is a process chart for illustrating an example of the inventive method for manufacturing a wire saw apparatus.

First, a step of measuring the surface roughness Rmax of the long roller 2 is performed (SP1 in FIG. 2).

The long roller 2, for example, made of a urethane having a Shore A hardness of 80 to 96 is preferably used. The use of the long roller 2 having a hardness within such a range facilitates the smooth movement of the wire 25, reduces the deformation and shape deterioration of the long roller 2, and can increase the durable number of times. Specifically, when the Shore A hardness is 80 or more, the long roller 2 is prevented from deforming, and the number of uses can be enhanced. When the Shore A hardness is 96 or less, the processing for reducing the surface roughness (polishing) can be efficiently performed.

Next, the wire 25 is extended from the wire supply reel 1 and wound around the wire winding reel 18. In this event, a step of measuring an angle a (°) of the tension arm 19 at which the tension arm 19 swings outside a range of the control angle of ±A (°) set in advance is performed (SP2 in FIG. 2).

Next, a step of calculating $R1 \times 2 \times A \div (|a|+A) = R2$ is performed, where R1 (μm) represents the measured surface roughness Rmax of the long roller 2 (SP3 in FIG. 2).

Next, a step of adjusting the surface roughness Rmax of the long roller 2 to the calculated numerical value R2 or less is performed (SP4 in FIG. 2). For example, the surface of the long roller 2 may be polished.

In this event, the surface of the long roller is preferably polished with a polishing film of #800 to 3000, so that the surface roughness Rmax of the long roller is adjusted to the calculated numerical value R2 or less.

The average particle diameters of #800 and #3000 are respectively 20 μm and 5 μm. The use of the mesh number #800 or higher more surely enables the surface roughness Rmax of the long roller 2 to be R2 or less. Meanwhile, the use of the mesh number #3000 or lower prevents the clogging of the polishing film, and allows efficient polishing. Note that a polishing agent used in the polishing film includes silicon carbide, aluminum oxide, cerium oxide, and the like.

The polishing film as described above can be used for the polishing, for example, by pressing the polishing film against the rotating long roller 2. Nevertheless, the polishing method is not limited thereto.

Moreover, this polishing can be performed multiple times on the same long roller. For example, as the wire saw apparatus 24 is continued to operate, when the surface roughness Rmax of the long roller 2 deteriorates, the surface of the long roller 2 may be polished again to make the surface roughness Rmax R2 or less.

Further, the method for adjusting the surface roughness Rmax of the long roller 2 to the calculated numerical value R2 or less does not has to be polishing. For example, the long roller may be replaced with one having a surface roughness Rmax of R2 or less.

In these manners, a wire saw apparatus including a long roller having a surface roughness Rmax of R2 or less is manufactured. The inventive method for manufacturing a wire saw apparatus as described above makes it possible to manufacture a wire saw apparatus in which the wire extending from the wire supply reel smoothly moves on the long roller in the axial direction, making it possible to prevent the tension arm from greatly swinging outside the control range. Thus, the wire breakage can be reduced.

EXAMPLES

Hereinafter, the present invention will be more specifically described with reference to Examples and Comparative Examples of the present invention. However, the present invention is not limited thereto.

Example 1

Figure 1B:
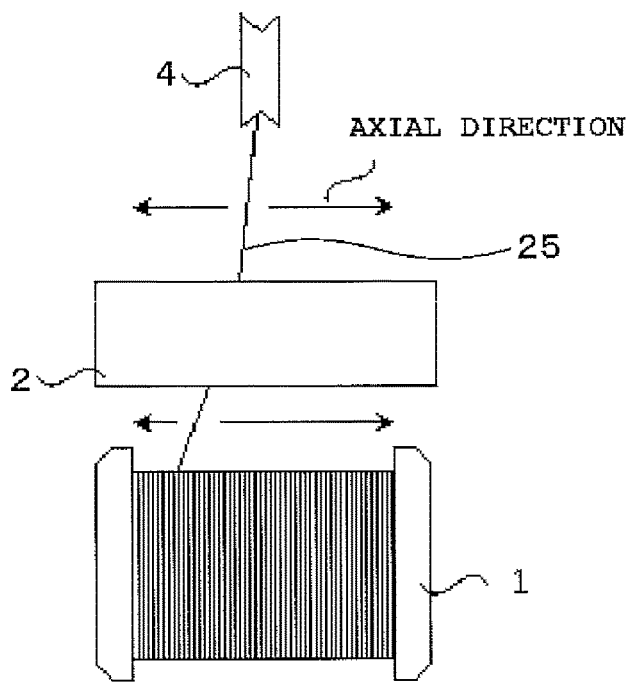
FIG. 1(b) is a schematic view showing a part of the wire saw apparatus, where a wire supply reel, a long roller, and a pulley are seen obliquely from the top (in the direction of the arrow (b') in FIG. 1(a)).

According to the inventive method for manufacturing a wire saw apparatus as illustrated in FIG. 2, a wire saw apparatus as shown in FIG. 1(a) was manufactured.

First, the long roller 2 made of a urethane having a Shore A hardness of 91 was prepared. The surface roughness Rmax of this long roller 2 was measured, and the result was R1 (μm)=34 μm. Moreover, the control angle of the tension arm 19 was set to ±A (°)=±1.5°.

Figure 3:
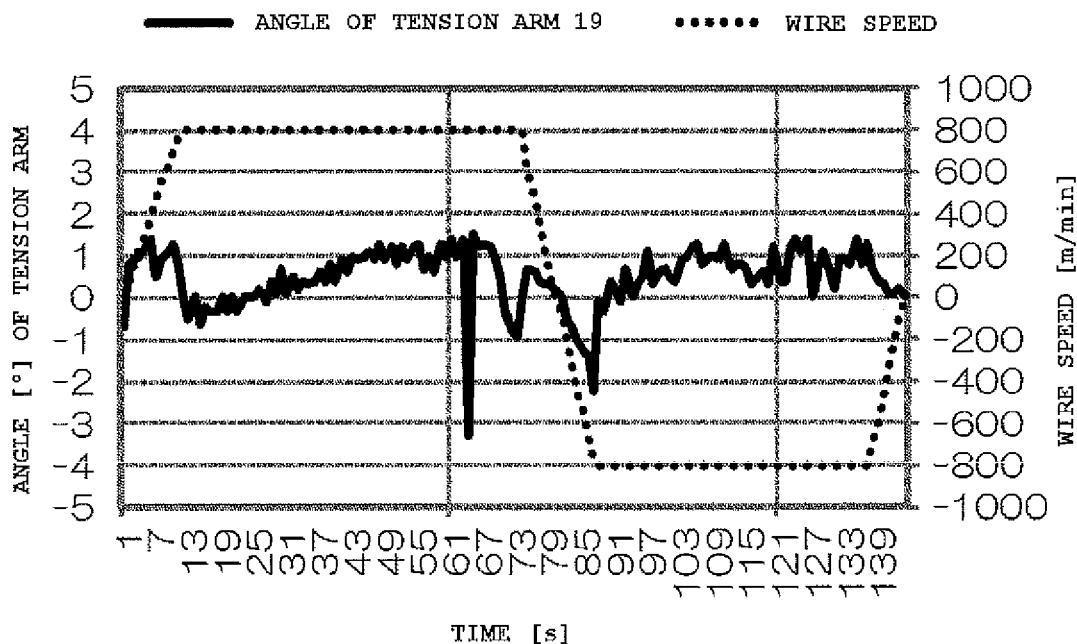
FIG. 3 is a graph for illustrating a movement of a tension arm when the long roller has a surface roughness Rmax of 34 μm.

Next, the wire 25 was extended from the wire supply reel 1 at a speed of 800 m/min. FIG. 3 shows the motion of the tension arm 19 measured in this event.

As a result, at around 63 seconds as shown in FIG. 3, the angle of the tension arm 19 unexpectedly varied from around 1.5° to around −3.2°.

As described above, when the tension arm 19 unexpectedly swung outside the control range, the angle a (°) of the tension arm 19 was −3.2°, and the surface roughness Rmax (R1) of the long roller 2 was 34 μm.

Thus, the surface roughness Rmax (R2) of the long roller 2 by which the swinging of the tension arm 19 outside the control range can be suppressed was calculated according to the relational equation of R1×2×A÷(|a|+A)=R2. The result was 34×2×1.5÷(|−3.2|+1.5)=22 μm.

Then, the long roller 2 having a surface roughness Rmax (R1) of 34 μm was polished with a polishing film of #2000 such that the surface roughness Rmax became R2 (=22 μm) or less. Specifically, the rotating long roller 2 was polished by pressing the polishing film thereagainst.

After the polishing, the surface roughness Rmax of the long roller 2 was measured. The result was 21 μm, which was smaller than the above value of R2.

Figure 4:
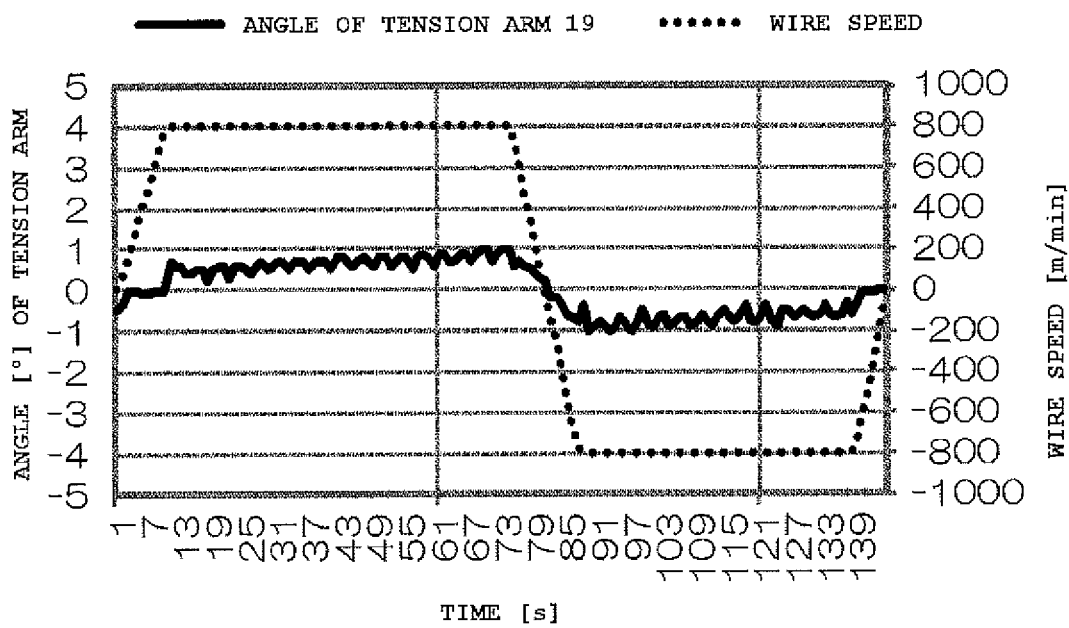
FIG. 4 is a graph for illustrating a movement of the tension arm when the long roller has a surface roughness Rmax of 21 μm.

This long roller 2 having a surface roughness Rmax of 21 μm was used to manufacture the wire saw apparatus 24. Subsequently, the wire 25 was extended at a wire speed of 800 m/min, and the motion of the tension arm 19 in this event was measured and shown in FIG. 4. As a result, the unexpected swinging of the tension arm 19 outside the control range shown in FIG. 3 was no longer observed in FIG. 4.

As described above, in Example 1, the tension arm 19 controlled to move within the control angle of ±A (°) set in advance is configured to apply tension in the wire saw apparatus 24. The long roller 2 was adjusted such that the surface roughness Rmax of the numerical value was R2 or less calculated according to R1×2×A÷(|a|+A), where R1 represents the surface roughness Rmax of the long roller 2, and a (°) represents the angle of the tension arm 19 on the wire supply reel 1 side at which the tension arm 19 unexpectedly swung outside the control range while the wire 25 was extending from the wire supply reel 1. By using such a long roller 2, the inventive wire saw apparatus 24 was successfully manufactured which is capable of preventing the tension arm 19 from unexpectedly greatly swinging outside the control range.

Comparative Example 1

Unlike Example 1, a wire saw apparatus was manufactured by preparing a long roller and each part without particularly considering the surface roughness Rmax of the long roller. Note that, as a reference, the surface roughness Rmax of the long roller in this situation was measured, and the result was 34 μm. In other words, the surface roughness Rmax was the same as that in the wire saw apparatus prepared at first in Example 1.

In this conventional wire saw apparatus, the control angle of tension arm was set to ±A (°)=±1.5°, and the wire was extended at a speed of 800 m/min as in Example 1. The motion of the tension arm was measured in this event, and the same result as that in FIG. 3 was obtained. Specifically, in the wire saw apparatus manufactured in Comparative Example 1, a phenomenon occurred in which the angle of the tension arm unexpectedly greatly varied outside the control range. Hence, a breakage is likely to occur in the apparatus.

Examples 2 to 4, Comparative Examples 2, 3

Although different from the long roller prepared in Example 1, a long roller having a surface roughness Rmax of 34 μm was prepared. This long roller was divided into five pieces in the axial direction (the width in the axial direction was divided into five regions), which were polished with polishing films of different mesh numbers #600, 800, 2000, 3000, and 4000, respectively. Abrasive grains used in the polishing films of #600, 800, 2000, 3000, and 4000 respectively had average diameters of 28, 20, 8, 5, and 3 μm. Note that, in consideration of the result in Example 1, it is conceivable that the surface roughness Rmax after polishing should be aimed at 22 μm or less (more preferably 21 μm or less) in order to prevent the phenomenon of unexpected large variation in the tension arm angle outside the control range.

Figure 5:
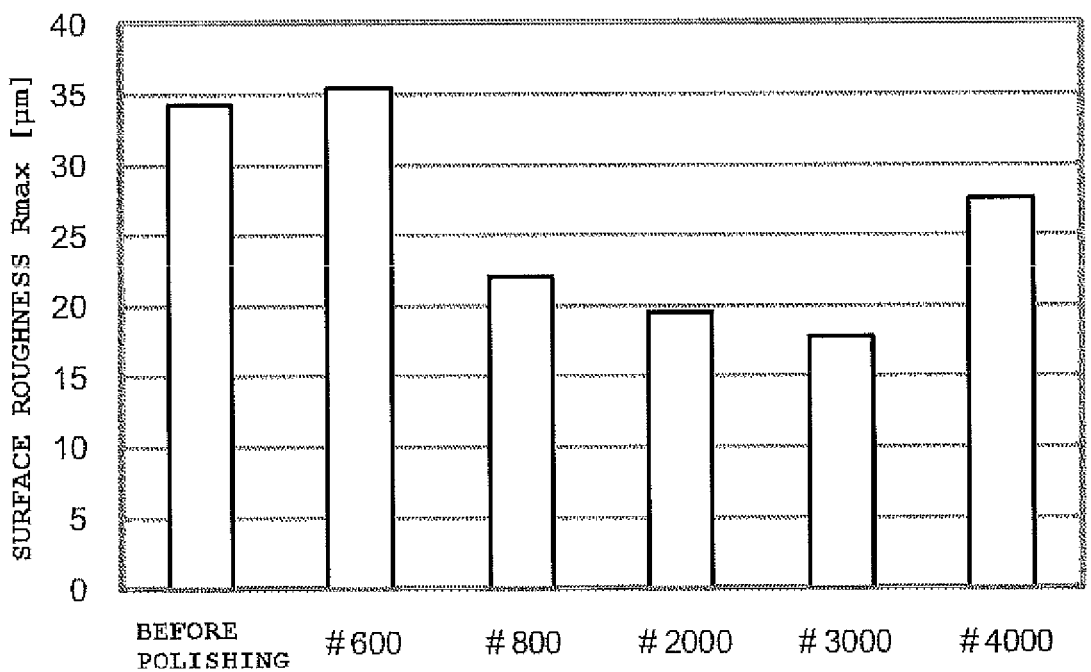
FIG. 5 is a graph showing the surface roughness Rmax in an axial direction of the long roller when the long roller having a surface roughness Rmax of 34 μm is polished with a polishing film of #600, 800, 2000, 3000, or 4000.

FIG. 5 shows the result of measuring the surface roughnesses Rmax in the axial direction of the long rollers before and after the polishing. As a result, in the case of #600, the surface roughness Rmax was 35 μm and degraded as shown in FIG. 5 (Comparative Example 2). In the case of #4000, the polishing film was clogged and became so slippery that effective polishing was impossible. The polishing was intercepted, and the resulting surface roughness Rmax was 27 μm (Comparative Example 3). On the other hand, in the cases of #800 to #3000, the surface roughnesses Rmax were respectively 22, 19, and 17 μm. All were 22 μm or less. Further, regarding #2000 and #3000, the surface roughnesses Rmax were 21 μm or less, and the polishing was performed as intended (Examples 2 to 4).

It should be noted that the present invention is not restricted to the above-described embodiments. The embodiments are merely examples so that any embodiments that have substantially the same feature and demonstrate the same functions and effects as those in the technical concept as disclosed in claims of the present invention are included in the technical range of the present invention.

The invention claimed is:

1. A method for manufacturing a wire saw apparatus, the method comprising the steps of:
    providing a wire saw apparatus including:
        a wire supply reel from which a wire extends;
        a long roller having a surface on which the wire extending from the wire supply reel can pass;
        a plurality of wire guides around which the wire is spirally wound;
        a wire winding reel which winds the wire; and
        a tension arm which is arranged between the wire supply reel and the wire guides, controlled to move within a control angle of ±A (°) set in advance, and configured to apply tension to the wire,
        wherein the wire is configured to pass on the long roller while moving in an axial direction of the long roller;
    measuring a surface roughness Rmax of the long roller;
    measuring an angle a (°) of the tension arm at which the tension arm swings outside a range of the control angle set in advance while the wire is extending from the wire supply reel;
    calculating R1×2×A÷(|a|+A)=R2, where R1 (μm) represents the measured surface roughness Rmax of the long roller; and
    adjusting the surface roughness Rmax of the long roller to the calculated numerical value R2 or less.

2. The method for manufacturing a wire saw apparatus according to claim 1, wherein the long roller used is made of a urethane having a Shore A hardness of 80 to 96.

3. The method for manufacturing a wire saw apparatus according to claim 1, wherein, in the step of adjusting the surface roughness Rmax of the long roller to the calculated numerical value R2 or less, the surface of the long roller is polished with a polishing film of #800 to 3000, so that the surface roughness Rmax of the long roller is adjusted to the calculated numerical value R2 or less.

4. The method for manufacturing a wire saw apparatus according to claim 2, wherein, in the step of adjusting the surface roughness Rmax of the long roller to the calculated numerical value R2 or less, the surface of the long roller is polished with a polishing film of #800 to 3000, so that the surface roughness Rmax of the long roller is adjusted to the calculated numerical value R2 or less.

\* \* \* \* \*